(12) United States Patent
Noda et al.

(10) Patent No.: US 7,929,316 B2
(45) Date of Patent: *Apr. 19, 2011

(54) COMPOSITE ELECTRONIC COMPONENT

(75) Inventors: Satoru Noda, Hikone (JP); Jun Harada, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/697,451

(22) Filed: Feb. 1, 2010

(65) Prior Publication Data
US 2010/0134990 A1 Jun. 3, 2010

Related U.S. Application Data

(63) Continuation of application No. 11/609,989, filed on Dec. 13, 2006, now Pat. No. 7,684,207, which is a continuation of application No. PCT/JP2005/011358, filed on Jun. 21, 2005, and a continuation of application No. PCT/JP2005/013724, filed on Jul. 27, 2005.

(30) Foreign Application Priority Data

Jul. 30, 2004 (JP) ................................. 2004-224922

(51) Int. Cl.
*H05K 1/11* (2006.01)
*H05K 1/14* (2006.01)
(52) U.S. Cl. ......... 361/795; 361/763; 361/766; 361/792
(58) Field of Classification Search .................. None
See application file for complete search history.

(56) References Cited

U.S. PATENT DOCUMENTS

| 6,680,441 | B2 * | 1/2004 | Kondo et al. ................ 174/260 |
| 6,803,324 | B2 * | 10/2004 | Ogawa et al. ................ 438/761 |
| 2003/0060172 | A1 | 3/2003 | Kuriyama et al. |
| 2003/0137045 | A1 | 7/2003 | Sugaya et al. |
| 2004/0077124 | A1 | 4/2004 | Ogawa |

FOREIGN PATENT DOCUMENTS

| JP | 2002-261449 A | 9/2002 |
| JP | 2002-271038 A | 9/2002 |
| JP | 2002-290051 A | 10/2002 |
| JP | 2003-100937 A | 4/2003 |
| JP | 2003-163459 A | 6/2003 |

OTHER PUBLICATIONS

Noda et al.; "Composite Electronic Component"; U.S. Appl. No. 11/609,989, filed Dec. 13, 2006.
Noda et al.; "Method of Manufacturing Composite Electronic Component"; U.S. Appl. No. 11/691,666, filed Mar. 27, 2007.
Official Communication issued in corresponding European Patent Application No. 05780155.7, mailed on Aug. 18, 2010.
Officail Communication issued in corresponding Japanese Patent Application No. 2006-527819, drafted on Aug. 7, 2009.

* cited by examiner

*Primary Examiner* — Tuan T Dinh
(74) *Attorney, Agent, or Firm* — Keating & Bennett, LLP

(57) ABSTRACT

A composite electronic component includes a multilayer wiring block having a plurality of insulating layers and a wiring pattern, and a chip-type electronic component built-in multilayer block having a plurality of insulating payers and a wiring pattern and including a first chip-type electronic component. The multilayer wiring block and the chip-type electronic component built-in multilayer block are electrically interconnected and arranged on substantially the same plane.

8 Claims, 9 Drawing Sheets

COMPOSITE ELECTRONIC COMPONENT

BACKGROUND OF THE INVENTION

1. Field of the Invention

The present invention relates to composite electronic components and methods for manufacturing the composite electronic components. More particularly, the present invention relates to a composite electronic component in which a plurality of types of substrates having different characteristics are integrated to provide a desired function and to achieve miniaturization and profile reduction, and to a method of manufacturing the composite electronic component.

2. Description of the Related Art

In recent years, with miniaturization and enhancement of functions of mobile communication devices, such as portable phones and electronic devices, miniaturization and enhancement of functions of electronic components have rapidly progressed. For example, in Japanese Patent No. 3375555 (Patent Document 1), a circuit component built-in module having a circuit components built therein and being modularized and a method of manufacturing the circuit component built-in module are disclosed.

The circuit component built-in module described in Patent Document 1 includes an electrical insulating substrate made of a mixture including an inorganic filler and a thermosetting resin, a plurality of wiring patterns disposed on at least one major surface of the electrical insulating substrate, and a circuit component embedded in the electrical insulating substrate and electrically connected to the wiring patterns. The circuit component and the wiring patterns are electrically connected through conductive adhesive or bumps. In addition, in Patent Document 1, a circuit component built-in module having a multilayer structure in which a plurality of electrical insulating substrates are laminated is disclosed. In Patent Document 1, an inner via connection method is used to increase the density and enhance the functions of the circuit component. In addition, a mixture including an inorganic filler and a thermosetting resin is used as a material for making the electrical insulating substrate, in order to increase reliability.

However, in a conventional composite electronic component, as in the circuit component built-in module described in Patent Document 1, a plurality of wiring patterns are disposed on at least one major surface of an electrical insulating substrate, and a circuit component connected to these wiring patterns is embedded in the electrical insulating substrate. Thus, when a plurality of different types of circuit components are built into the electrical insulating substrate so that the electrical insulating substrate has various functions, the heights of the circuit components are limited to the height of the electrical insulating substrate. In addition, since it is difficult to arrange a wiring layer inside the electrical insulating substrate in which the circuit components are embedded, despite the presence of high-density wiring, it is inevitable that the wiring layer has to be provided on the top or bottom surface of the electrical insulating substrate. Thus, there has been a problem in that it is difficult to reduce the profile of a composite electronic component.

SUMMARY OF THE INVENTION

To overcome the problems described above, preferred embodiments of the present invention provide a composite electronic component in which various substrates and electric components having different functions are combined to provide various functions which achieve miniaturization and profile reduction, and provide a method of manufacturing the composite electronic component.

A composite electronic component according to a preferred embodiment of the present invention includes at least two of a multilayer wiring block having a plurality of laminated insulating layers and a wiring pattern, a chip-type electronic component built-in multilayer block having a plurality of laminated insulating layers and including a first chip-type electronic component, and a second chip-type electronic component including a passive component or an active component. In this composite electronic component, at least two of the multilayer wiring block, the chip-type electronic component built-in multilayer block, and the second chip-type electronic component are electrically interconnected and arranged on substantially the same plane.

In a composite electronic component according to this preferred embodiment, at least two of the multilayer wiring block, the chip-type electronic component built-in multilayer block, and the second chip-type electronic component are integrated by a resin.

At least two of the multilayer wiring block, the chip-type electronic component built-in multilayer block, and the second chip-type electronic component are preferably mounted on a supporting substrate having a surface wiring pattern.

In the composite electronic component according to this preferred embodiment, the multilayer wiring block, the chip-type electronic component built-in multilayer block, and the second chip-type electronic component are preferably included.

At least two of the multilayer wiring block, the chip-type electronic component built-in multilayer block, and a chip-type electronic component block in which the second chip-type electronic component are resin-sealed are preferably integrated by a resin block.

The resin block preferably includes a connecting wiring for electrically interconnecting at least two of the multilayer wiring block, the chip-type electronic component built-in multilayer block, and the chip-type electronic component block.

In a composite electronic component according to this preferred embodiment of the present invention, the multilayer wiring block, the chip-type electronic component built-in multilayer block, and the chip-type electronic component block are preferably integrated by a resin block.

In a composite electronic component according to this preferred embodiment, the multilayer wiring block and the chip-type electronic component built-in multilayer block are preferably made of different materials.

A method of manufacturing a composite electronic component according to another preferred embodiment of the present invention includes the steps of mounting at least two of a multilayer wiring block having a plurality of laminated insulating layers and a wiring pattern, a chip-type electronic component built-in multilayer block having a plurality of laminated insulating layers and including a first chip-type electronic component, and a second chip-type electronic component, on a supporting substrate having a surface wiring pattern, covering at least two of the multilayer wiring block, the chip-type electronic component built-in multilayer block, and the second chip-type electronic component, with a resin sheet, and press-bonding the resin sheet to the at least two of the multilayer wiring block, the chip-type electronic component built-in multilayer block, and the second chip-type electronic component.

In a method of manufacturing a composite electronic component according to this preferred embodiment, the steps of mounting each of the multilayer wiring block, the chip-type electronic component built-in multilayer block, and a second chip-type electronic component on a supporting substrate having a surface wiring pattern, covering the multilayer wiring block, the chip-type electronic component built-in multilayer block, and the second chip-type electronic component, with a resin sheet, and press-bonding the resin sheet to the multilayer wiring block, the chip-type electronic component built-in multilayer block, and the second chip-type electronic component are preferably included.

A method of manufacturing a composite electronic component according to another preferred embodiment of the present invention includes the steps of arranging at least two of a multilayer wiring block having a plurality of laminated insulating layers and a wiring pattern, a chip-type electronic component built-in multilayer block having a plurality of laminated insulating layers and including a first chip-type electronic component, and a chip-type electronic component block in which a second chip-type electronic component is resin-sealed, and a resin block having a wiring pattern, and press-bonding and electrically interconnecting at least two of the multilayer wiring block, the chip-type electronic component built-in multilayer block, and the second chip-type electronic component, by the resin block.

In a method of manufacturing a composite electronic component according to this preferred embodiment, the steps of arranging each of the multilayer wiring block, the chip-type electronic component built-in multilayer block, the chip-type electronic component block, and the resin block, and press-bonding and electrically interconnecting the multilayer wiring block, the chip-type electronic component built-in multilayer block, and the second chip-type electronic component, through the resin block are preferably included.

According to preferred embodiments of the present invention, a composite electronic component is provided in which various substrates and electronic components having different functions are combined, so as to provide various functions and achieve miniaturization and profile reduction and a method of manufacturing the composite electronic component.

Other features, elements, steps, characteristics and advantages of the present invention will become more apparent from the following detailed description of preferred embodiments thereof with reference to the attached drawings.

BRIEF DESCRIPTION OF THE DRAWINGS

FIG. 1A is a cross-sectional diagram of the composite electronic component, and FIG. 1B is a cross-sectional diagram showing an enlarged view of a portion of the composite electronic component.

FIG. 3A is a diagram illustrating a state in which a multilayer wiring block and other components are provided on a supporting substrate, and FIG. 3B is a diagram illustrating a state in which a resin sheet is press-bonded.

FIG. 9A is a perspective diagram illustrating major portions of steps in another preferred embodiment of a manufacturing method of a composite electronic component of the present invention, and FIG. 9B is a cross-sectional diagram illustrating a composite electronic component created in accordance with the manufacturing method illustrated in FIG. 9A.

DETAILED DESCRIPTION OF PREFERRED EMBODIMENTS

First Preferred Embodiment

In the following, the present invention will be described with reference to preferred embodiments illustrated in FIG. 1 to FIG. 14.

Figure 1A:
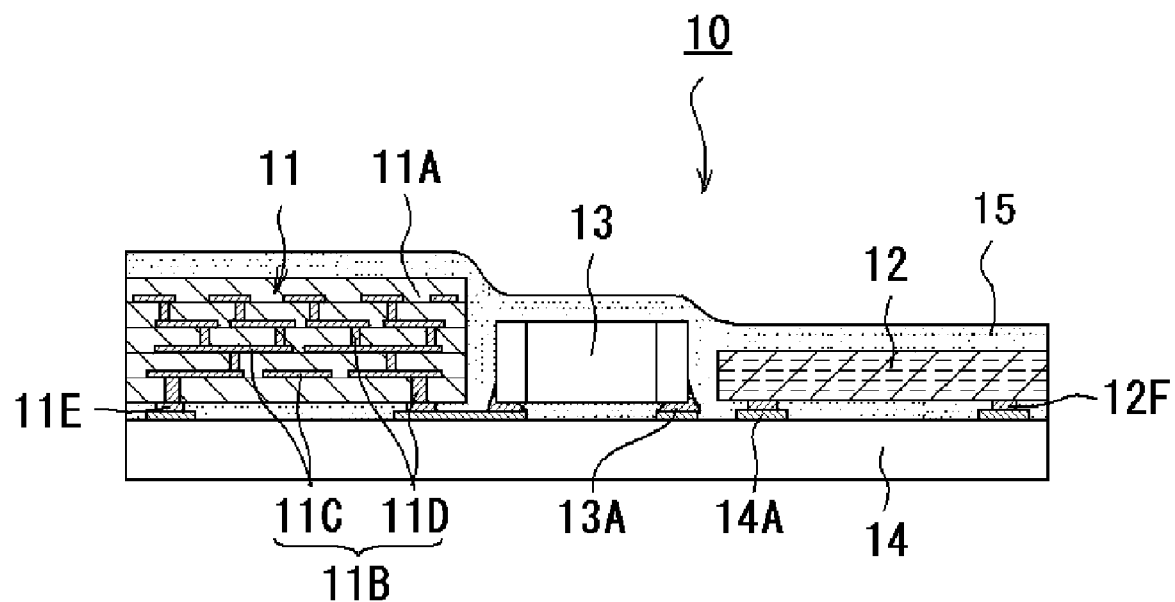
FIGS. 1A and 1B show diagrams illustrating a preferred embodiment of a composite electronic component of the present invention.
Figure 1B:
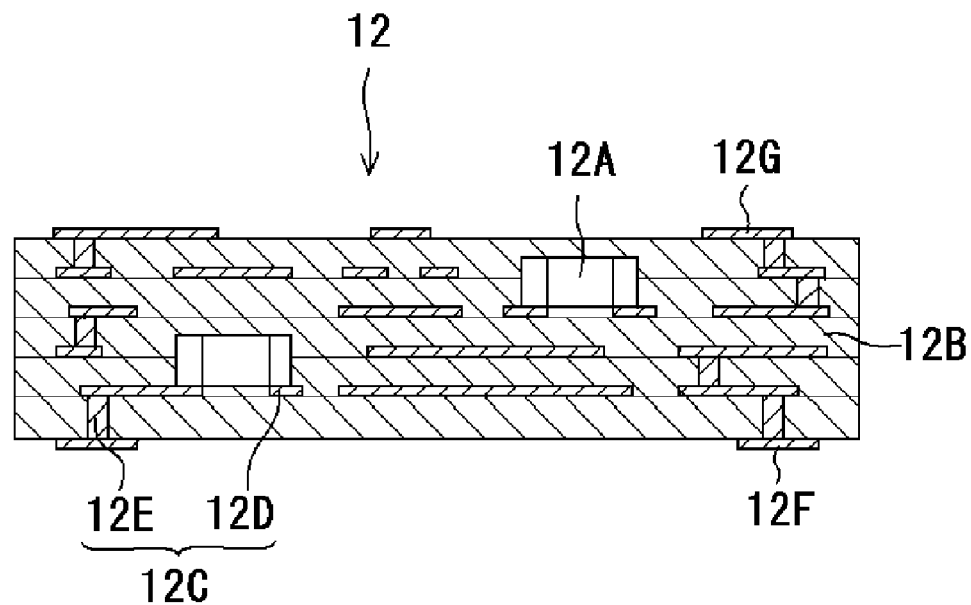

As illustrated in FIGS. 1A and 1B, a composite electronic component 10 of the present preferred embodiment includes a multilayer wiring block 11, a chip-type electronic component built-in multilayer block 12 including a first chip-type electronic component 12A therein, a second chip-type electronic component 13, a supporting substrate 14 having these three parts 11, 12, and 13 disposed thereon and supporting these three parts, and a resin portion 15 sealing the multilayer wiring block 11, the chip-type electronic component built-in multilayer block 12, and the second chip-type electronic component 13 on the supporting substrate 14 so as to integrate these three parts. The multilayer wiring block 11, the chip-type electronic component built-in multilayer block 12, and the second chip-type electronic component 13 are electrically interconnected on the supporting substrate 14 via a surface wiring pattern 14A provided on the surface of the supporting substrate 14.

The multilayer wiring block 11 is made by dividing a wiring portion of the composite electronic component 10 into blocks. The multilayer wiring block 11 is a block defining a passive functional portion as a wiring pattern. As illustrated in FIG. 1A, for example, this multilayer wiring block 11 has a laminated body including a plurality of laminated insulating layers 11A and a wiring pattern 11B disposed inside the laminated body in a predetermined pattern. This wiring pattern 11B includes a plurality of inner conducting planes 11C each arranged between the individual insulating layers 11A, and via hole conductors 11D each penetrating the individual insulating layers 11A and electrically connecting upper and lower inner conducting planes 11C. The multilayer wiring block 11 may include a passive element, such as an inductor, capacitor, or other suitable passive element, connected to appropriate inner conducting planes 11C. The multilayer wiring block 11 is connected to the surface wiring pattern 14A of the supporting substrate 14 through an external terminal electrode 11E disposed on the bottom surface of the multilayer wiring block 11.

The insulating layers 11A may be made, for example, of a thermosetting resin such as an epoxy resin, a phenolic resin, and a cyanate resin. In this case, the multilayer wiring block 11 may be formed using, for example, a build-up method, and the inner conducting planes 11C may be formed by patterning metal foil such as copper foil, for example. The via hole conductors 11D may be formed by filling via holes disposed in the insulating layers 11A with conductive paste. The conductive paste is a conductive resin composition including, for example, metal particles and a thermosetting resin. For the metal particles, a metal such as gold, silver, copper, and nickel, for example, may be used. For the thermosetting resin, a resin such as an epoxy resin, a phenolic resin, and a cyanate resin, for example, may be used.

In addition, the insulating layers 11A may be made of a ceramic material having low conductivity. For the ceramic material, a low temperature sintering ceramic material is preferred. For the low temperature sintering ceramic material, ceramic powder such as alumina, forsterite, and cordierite, a glass composite material including borosilicate glass mixed with such ceramic powder, a crystallized glass material using crystallized glass of the $ZnO$—$MgO$—$Al_2O_3$—$SiO_2$ system, and a non-glass material using ceramic powder of the $BaO$—$Al_2O_3$—$SiO_2$ system, ceramic powder of the $Al_2O_3$—$CaO$—$SiO_2$—$MgO$—$B_2O_3$ system, for example, may be used. In these cases, the inner conducting planes 11C and the via hole conductors 11D may be integrated by co-firing of a metal having a low resistance and a low melting point such as Ag, Cu, with a low temperature sintering ceramic material, at a low temperature.

The chip-type electronic component built-in multilayer block 12, similar to the multilayer wiring block 11, is a block functioning primarily as a passive functional portion of the composite electronic component 10. As illustrated in FIGS. 1A and 1B, the chip-type electronic component built-in multilayer block 12 includes a first chip-type electronic component 12A and is formed as a laminated body having a plurality of laminated insulating layers 12B, inside of which a wiring pattern 12C is disposed, similar to the multilayer wiring block 11.

Figure 2A:
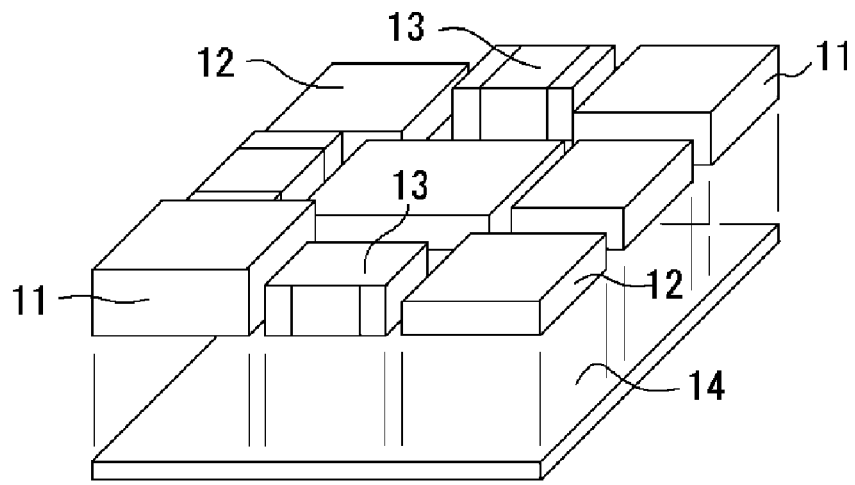
FIG. 2A-2C show perspective diagrams illustrating a manufacturing method of the composite electronic component illustrated in FIGS. 1A and 1B in the order of steps.
Figure 2B:
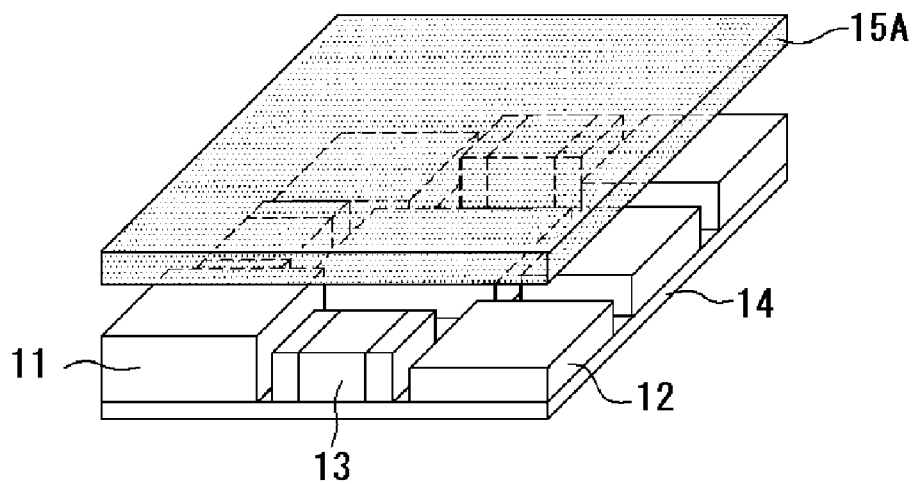

The first chip-type electronic component 12A is made of a ceramic sintered body such as a chip-type condenser, a chip-type inductor, and a chip-type resistor, for example. The insulating layers 12B are preferably made primarily of a mixture of an inorganic filler and a thermosetting resin such as an epoxy resin. The insulating layers 12B may be formed of a material different from the material from which the above-described insulating layers 11A are formed, such as a ceramic and a resin, or an epoxy resin including an epoxy resin and an inorganic filler. As illustrated in FIG. 2B, the wiring pattern 12C includes, for example, a plurality of inner conducting planes 12D each provided between the individual insulating layers 12B, via hole conductors 12E each penetrating the individual insulating layers 12B and electrically connecting an upper and a lower inner conducting planes 12D, a first external terminal electrode 12F disposed on the bottom surface of the laminated body, and a second external terminal electrode 12G disposed on the top surface of the laminated body. The first chip-type electronic component 12A is disposed at an appropriate position on the inner conducting planes 12D. The chip-type electronic component built-in multilayer block 12 is connected to the surface wiring pattern 14A of the supporting substrate 14 through the first external terminal electrode 12F disposed on the bottom surface. An active element such as a silicon semiconductor may be provided in the second external terminal electrode 12G on the top surface of the chip-type electronic component built-in multilayer block 12 as necessary.

The second chip-type electronic component 13 is defined, for example, by a passive element made from a ceramic sintered body or an active element made from a silicon semiconductor, and is electrically connected to the surface wiring pattern 14A of the support body 14 through the external terminal electrode 13A provided on the bottom surface, as illustrated in FIG. 1A. This second chip-type electronic component 13 is electrically interconnected through the supporting substrate 14 to and cooperates with the multilayer wiring block 11 and the chip-type electronic component built-in multilayer block 12, thus providing various functions in the composite electronic component 10.

The second chip-type electronic component 13 and the first chip-type electronic component 12A included in the chip-type electronic component built-in multilayer block 12 are basically classified according to size. It is difficult to build a chip-type electronic component in a laminated body if the thickness, length, and width of the chip-type electronic component are greater than about 0.8 mm, about 1.6 mm, and about 0.8 mm, respectively. Thus, such a chip-type electronic component is arranged along with the multilayer wiring block 11, as the second chip-type electronic component 13. Accordingly, a chip-type electronic component having a size smaller than the above size is built in the chip-type electronic component built-in multilayer block 12 and used as the first chip-type electronic component 12A.

The supporting substrate 14 may be, but not particularly limited to, a resin multilayer substrate or a ceramic multilayer substrate, for example, as long as it has a surface wiring pattern 14A.

As described above, according to the present preferred embodiment, the composite electronic component 10 is provided with the multilayer wiring block 11, the chip-type electronic component built-in multilayer block 12, and the second chip-type electronic component 13, each having a different function. These are electrically interconnected and arranged on the same plane, and thus, the composite electronic component 10 provides a plurality of functions to achieve enhanced functions, miniaturization, and profile reduction of substrates.

Further, according to the present preferred embodiment, the insulating layers 11A of the multilayer wiring block 11 and the insulating layers 12B of the chip-type electronic component built-in multilayer block 12 may be made of different materials. For example, an organic material is used for one and an inorganic material is used for the other. Thus, even if the composite electronic component 10 is mounted on the supporting substrate 14 made of a different type of material, the residual stresses of the individual blocks 11 and 12 that define the composite electronic component 10 are different from each other. Each of the residual stresses can be relaxed on the supporting substrate 14, which suppresses negative effects of physical characteristics, such as strain, and thus increases reliability.

Figure 2C:
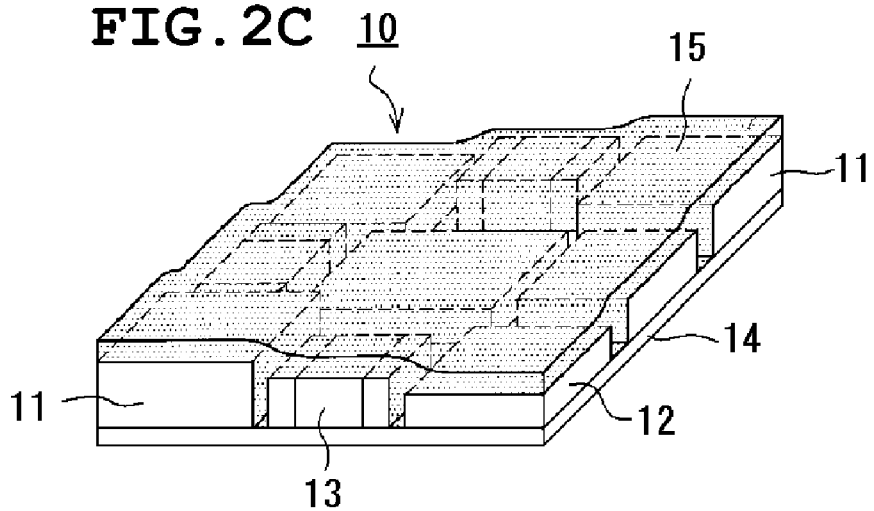
Figure 3A:
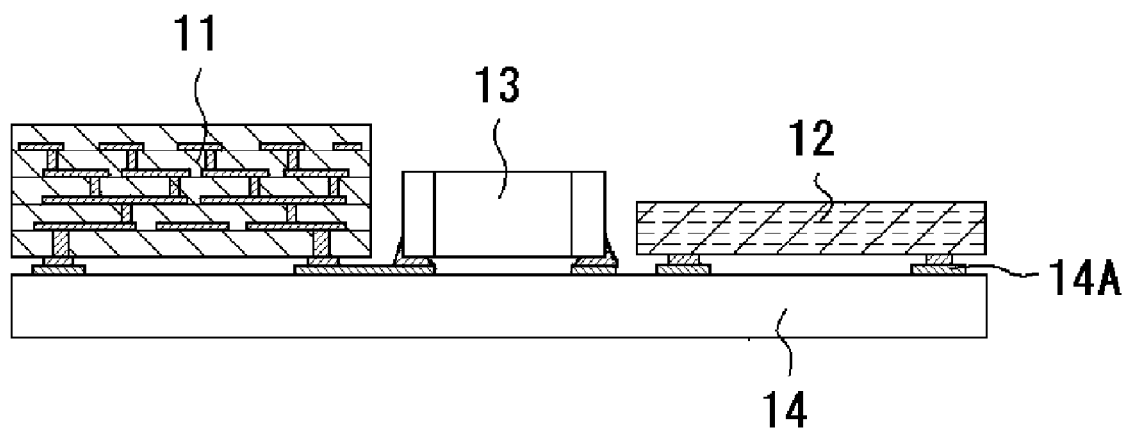
FIGS. 3A and 3B show cross-sectional diagrams in the steps illustrated in FIGS. 2A-2C.

Next, referring to FIGS. 2A-3B, a preferred embodiment of a method of manufacturing the composite electronic component 10 illustrated in FIGS. 1A and 1B will be described. In manufacturing the composite electronic component 10, the multilayer wiring block 11, the chip-type electronic component built-in multilayer block 12, the second chip-type electronic component 13, and the supporting substrate 14, which have been manufactured in advance, are prepared. Then, as illustrated in FIG. 2A, each of the multilayer wiring block 11, the chip-type electronic component built-in multilayer block 12, and the second chip-type electronic component 13 is aligned at a predetermined position on the surface wiring pattern 14A of the supporting substrate 14 and then mounted on the supporting substrate 14, as illustrated in FIG. 3A.

Figure 3B:
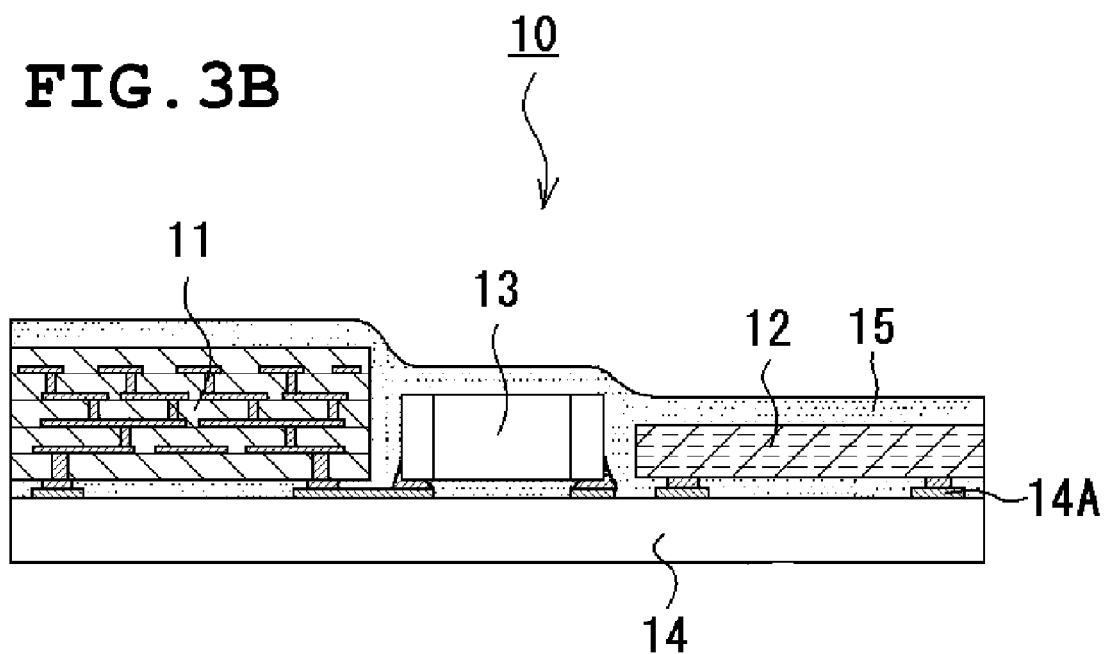

Subsequently, as illustrated in FIG. 2B, a resin prepreg sheet 15A in an uncured state (i.e., B-stage state) is arranged above the supporting substrate 14. The prepreg sheet 15A is then placed over the multilayer wiring block 11, the chip-type electronic component built-in multilayer block 12, and the second chip-type electronic component 13, and heat-press-bonded at a temperature higher than the curing temperature of the uncured resin portion. This causes the resin to flow, filling a space between each of the multilayer wiring block 11, chip-type electronic component built-in multilayer block 12, and the second chip-type electronic component 13 and to cover the top surfaces of these parts, as illustrated in FIG. 2C. Then the uncured resin portion is heat-cured so that the multilayer wiring block 11, chip-type electronic component built-in multilayer block 12, and the second chip-type electronic component 13 are integrated by the resin portion 15. With this process, the composite electronic component 10 as illustrated in FIG. 3B is obtained.

Thus, according to the manufacturing method according to the present preferred embodiment, a substrate and an electronic component produced through different manufacturing processes, i.e., the multilayer wiring block 11, the chip-type electronic component built-in multilayer block 12, and the second chip-type electronic component 13, are appropriately combined, so that the composite electronic component 10 provided with various functions is manufactured.

Figure 4:
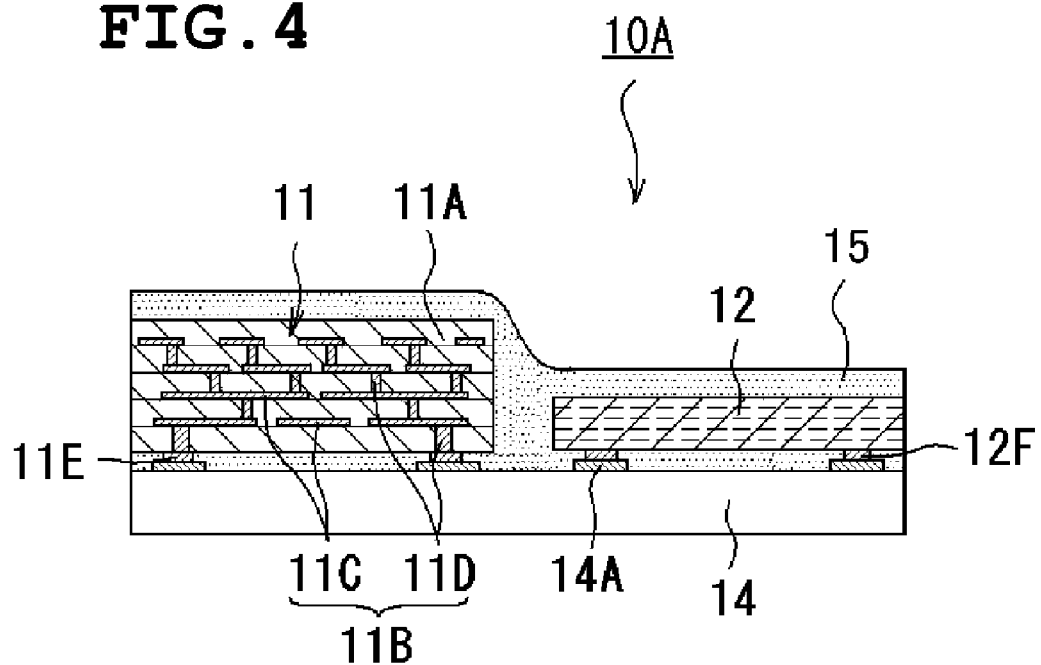
FIG. 4 is a cross-sectional diagram illustrating another preferred embodiment of a composite electronic component of the present invention.
Figure 5:
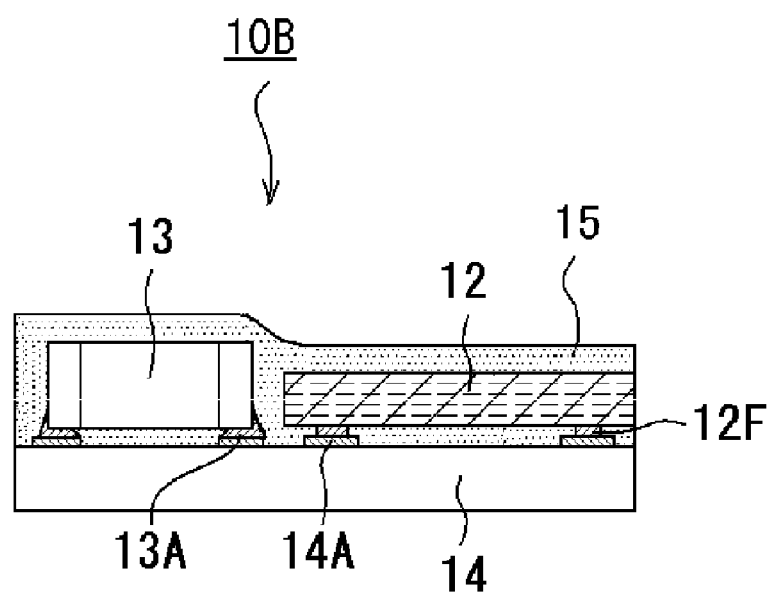
FIG. 5 is a cross-sectional diagram illustrating a further preferred embodiment of a composite electronic component of the present invention.
Figure 6:
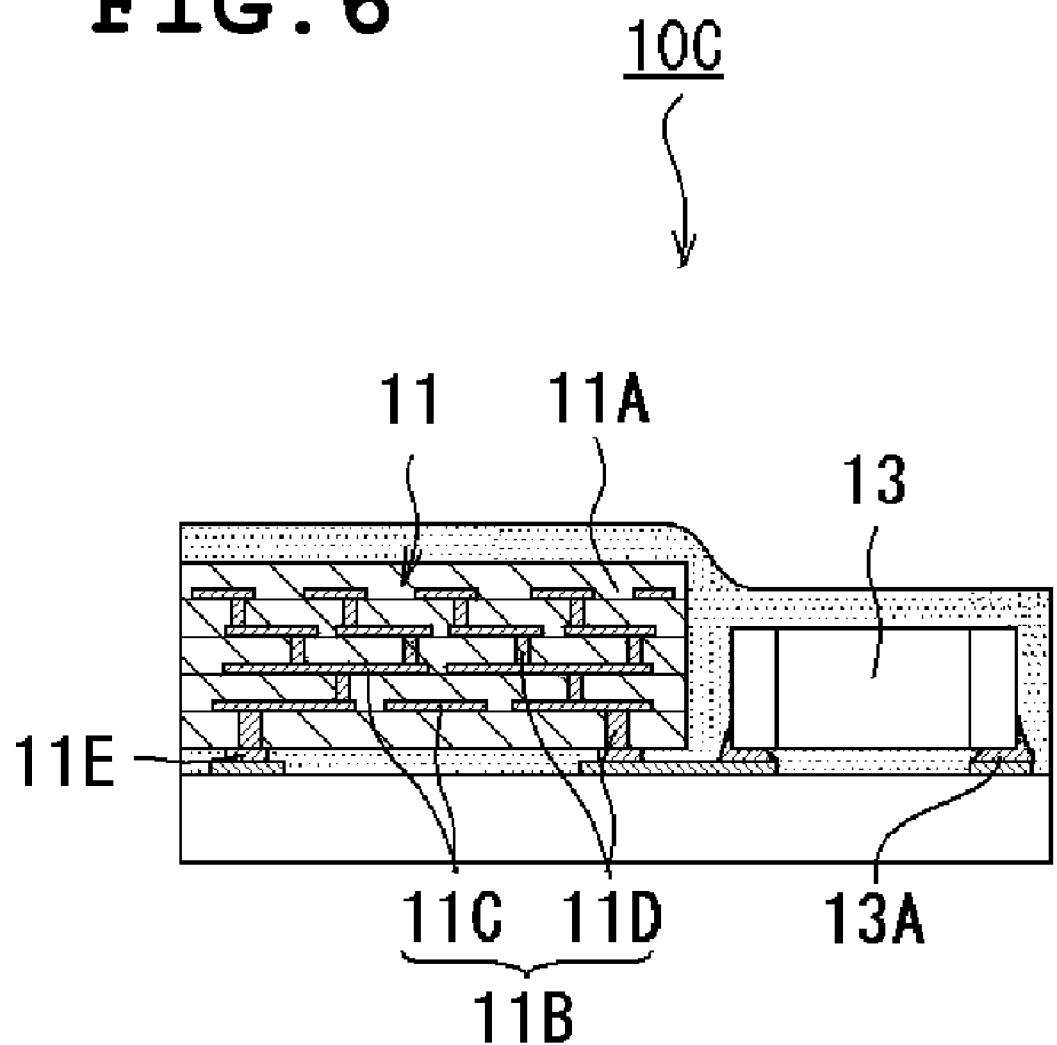
FIG. 6 is a cross-sectional diagram illustrating a further preferred embodiment of a composite electronic component of the present invention.

In the first preferred embodiment, the composite electronic component 10 is described, in which the multilayer wiring block 11, the chip-type electronic component built-in multilayer block 12, and the second chip-type electronic component 13 are provided, and these three parts 11, 12, and 13 are electrically interconnected on the supporting substrate 14 through the surface wiring pattern 14A. However, in the composite electronic component according to the present preferred embodiment of the present invention, it may be possible that, as illustrated in FIGS. 4 to 6, at least two of the multilayer wiring block 11, the chip-type electronic component built-in multilayer block 12, and the second chip-type electronic component 13 are appropriately selected according to need, and the selected two parts are arranged on the same supporting substrate 14 and electrically interconnected. Modified examples will be described. In this description, the same reference numerals as those used in the present preferred embodiment are used to designate the same or equivalent parts.

As illustrated in FIG. 4, a composite electronic component 10A of a first modified example is configured according to the first preferred embodiment and includes a multilayer wiring block 11, a chip-type electronic component built-in multilayer block 12, a supporting substrate 14 for supporting both the parts 11 and 12, and a resin portion 15 covering the multilayer wiring block 11 and the chip-type electronic component built-in multilayer block 12 on the supporting substrate 14. The multilayer wiring block 11 and the chip-type electronic component built-in multilayer block 12 are electrically connected through a surface wiring pattern 14A disposed on the surface of the supporting substrate 14. Thus, by disposing the multilayer wiring block 11, which shares the wiring separately from the wiring pattern 12C of the chip-type electronic component built-in multilayer block 12, to a side of the chip-type electronic component built-in multilayer block 12, the wiring pattern 12C of the chip-type electronic component built-in multilayer block 12 can be laterally expanded. With this arrangement, profile reduction of the composite electronic component 10A is achieved in a similar manner to the first preferred embodiment.

As illustrated in FIG. 5, a composite electronic component 10B of a second modified example is configured in accordance with the first preferred embodiment, and includes a chip-type electronic component built-in multilayer block 12, a second chip-type electronic component 13, a supporting substrate 14 for supporting both the parts 12 and 13, and a resin portion 15 covering the chip-type electronic component built-in multilayer block 12 and the second chip-type electronic component 13 on the supporting substrate 14. The chip-type electronic component built-in multilayer block 12 and the second chip-type electronic component 13 are electrically connected through a surface wiring pattern 14A disposed on a surface of the supporting substrate 14. For example, when the second chip-type electronic component 13 includes a coil component, the second chip-type electronic component 13 is disposed at a side of the chip-type electronic component built-in multilayer block 12. Thus, no wiring pattern is provided above or below the second chip-type electronic component 13 including the coil component, and further, the second chip-type electronic component 13 is sealed with the resin portion 15. Therefore, a magnetic field caused by the coil component is not substantially affected by the wiring pattern 12C of the chip-type electronic component built-in multilayer block 12. Thus, the reliability of the composite electronic component 10B is increased. In addition, a chip-type electronic component having a coil component is provided as the second chip-type electronic component 13, not as the first chip-type electronic component 12A, disposed independently of a wiring pattern. Thus, a magnetic field based on the coil component is hardly affected by the wiring pattern 12C of the chip-type electronic component built-in multilayer block 12. With this arrangement, the magnetic field caused by the coil component is not substantially affected by the wiring pattern 12C in the chip-type electronic component built-in multilayer block 12. Thus, the reliability of the composite electronic component 10B is increased in a similar manner to the first preferred embodiment.

As illustrated in FIG. 6, a composite electronic component 10C of a third modified example is configured in accordance with the first preferred embodiment and includes the multilayer wiring block 11, the second chip-type electronic component 13, the supporting substrate 14 for supporting both the parts 11 and 13, and the resin portion 15 covering the multilayer wiring block 11 and the second chip-type electronic component 13 on the supporting substrate 14. The multilayer wiring block 11 and the chip-type electronic component 13 are electrically connected through the surface wiring pattern 14A disposed on a surface of the supporting substrate 14. When the second chip-type electronic component 13 includes a coil component, the second chip-type electronic component 11 is disposed at a side of the second chip-type electronic component 13. Thus, no wiring pattern is provided above or below the second chip-type electronic component 13, and further, the second chip-type electronic component 13 is sealed with the resin portion 15. Therefore, a magnetic field caused by the coil component is not substantially affected by the wiring pattern 11B of the multilayer wiring block 11, and the reliability of the composite electronic component 10C is increased in a similar manner to the first preferred embodiment.

Now, referring to FIG. 7 to FIG. 14, other preferred embodiments of the composite electronic component of the present invention will be described. The same reference numerals as those in the above-described preferred embodiment are used to designate the same or equivalent parts.

Second Preferred Embodiment

Figure 7:
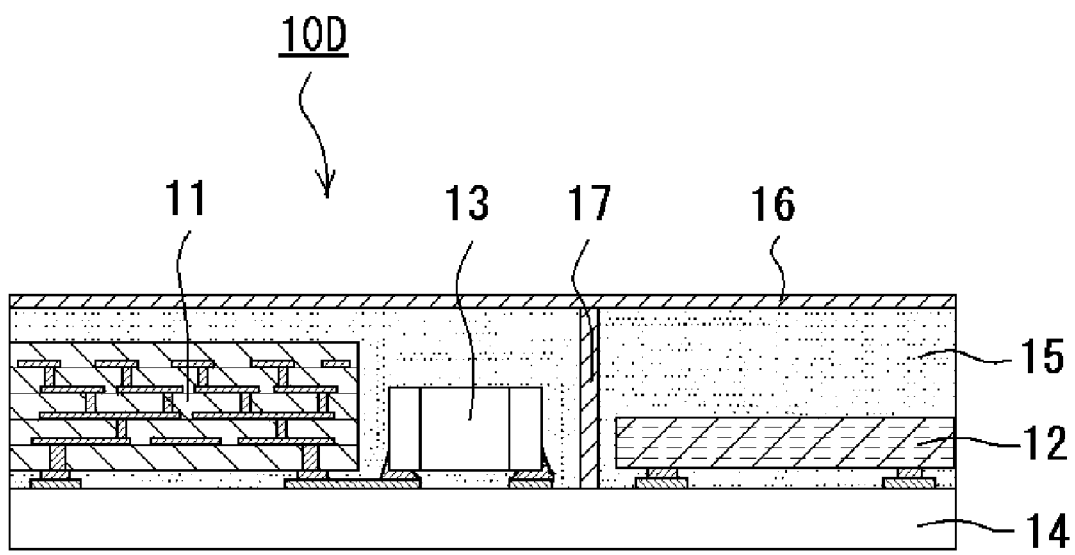
FIG. 7 is a cross-sectional diagram illustrating a further preferred embodiment of a composite electronic component of the present invention.

As illustrated in FIG. 7, a composite electronic component 10D of the present preferred embodiment is configured in accordance with the above-described preferred embodiment, except that it includes a shield electrode and a via hole conductor. Specifically, the composite electronic component 10D of the present preferred embodiment includes a multilayer wiring block 11, a chip-type electronic component built-in multilayer block 12, a second chip-type electronic component 13, and a supporting substrate 14, as illustrated in FIG. 7. The multilayer wiring block 11, the chip-type electronic component built-in multilayer block 12, and the second chip-type electronic component 13 are integrated on a supporting substrate 14 by the resin portion 15 made of a prepreg sheet. The top surface of the resin portion 15 is planarized, and a shield electrode 16 is disposed on the planarized top surface. This shield electrode 16 and the supporting substrate 14 are electrically connected through a via hole conductor 17 having a cross-section in the shape of a circle, an oval, or other suitable shape, for example.

Thus, the interior of the composite electronic component 10D is protected from an external magnetic environment. In addition, the via hole conductor 17 is interposed between the chip-type electronic component built-in multilayer block 12 and the second chip-type electronic component 13. This arrangement suppresses electromagnetic interference between the chip-type electronic component built-in multilayer block 12 and the second chip-type electronic component 13, which are arranged side by side. Thus, the space between each of the blocks 11 and 12 and second the chip-type electronic component 13 is reduced. This enables high density implementation and, consequently, miniaturization of the composite electronic component 10D.

When the shield electrode 16 and the via hole conductor 17 are provided, the top surface of a resin prepreg sheet having metal powder, such as copper powder adhered thereto, which is heat-press-bonded similarly to the above-described preferred embodiment, is planarized. Then, the metal powder on the top surface is etched into a predetermined pattern using a photo lithography technique and an etching technique. Subsequently, a via hole is formed by irradiating $CO_2$ laser light onto a predetermined area on the resin portion 15. After a desmear process is performed on each via hole, the via hole is filled with copper metals in the order of electroless copper plating and electrolytic copper plating, so that the via hole conductor 17 is formed, and the shield electrode 16 and the surface wiring pattern 14A of the supporting substrate 14 are electrically connected.

As described in the foregoing, according to the present preferred embodiment, the same effects as those in the first preferred embodiment are achieved. In addition, the interior of the chip-type electronic component 10D can be protected from an external magnetic environment using the shield electrode 16, and electromagnetic interference between the chip-type electronic component built-in multilayer block 12 and the second chip-type electronic component 13, which are arranged side by side, is prevented. This enables a space between the parts 12 and 13 to be reduced so that the density is increased.

Third Preferred Embodiment

Figure 8:
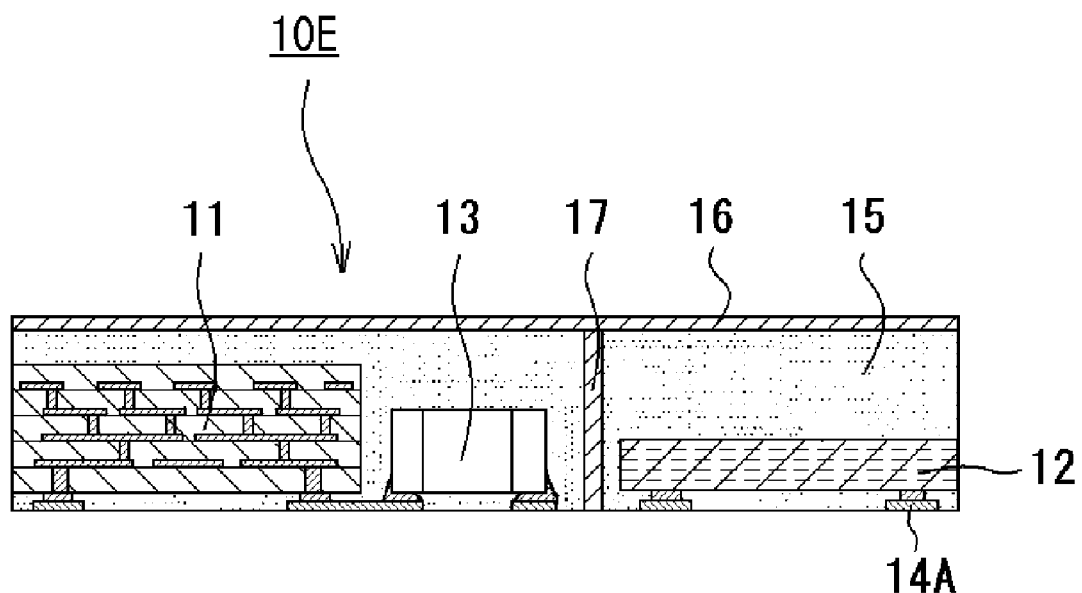
FIG. 8 is a cross-sectional diagram illustrating a further preferred embodiment of a composite electronic component of the present invention.

A composite electronic component 10E of the present preferred embodiment is configured similar to the composite electronic component 10D illustrated in FIG. 7, except that it does not include the supporting substrate 14 of the composite electronic component 10D. As illustrated in FIG. 8, the composite electronic component 10E of the present preferred embodiment may be disposed, for example, on a detachable transfer sheet or a detachable transfer film (not shown). When the composite electronic component 10E is provided on a mounting substrate, such as a mother substrate, the transfer sheet or the transfer film is detached from the composite electronic component 10E and provided on the mounting substrate. Specifically, a metal foil such as a copper foil, for example, is detachably attached to the transfer sheet. After the surface wiring pattern 14A is formed into a predetermined pattern using a photo lithography technique and an etching technique, the multilayer wiring block 11, the chip-type electronic component built-in multilayer block 12, and the second chip-type electronic component 13 are arranged in accordance with the surface wiring pattern 14A. Then, a resin prepreg sheet is press-bonded so that the multilayer wiring block 11, the chip-type electronic component built-in multilayer block 12, and the second chip-type electronic component 13 are integrated. Thus, the composite electronic component 10E is obtained. Specifically, in the composite electronic component 10E, implementation on a mounting substrate, such as a mother substrate, is performed in accordance with the wiring pattern 14A directly connected to the external terminal electrode of each of the blocks.

According to the present preferred embodiment, the same operation effects as those in each of the above-described embodiments can be expected. In addition, by creating the composite electronic component 10E on the detachable transfer sheet or transfer film, the composite electronic component 10E can be mounted on a predetermined mounting substrate simply by detaching the transfer sheet of transfer film as necessary.

Fourth Preferred Embodiment

Also in the present preferred embodiment, the preferred embodiment will be described using the same reference numerals as those in each of the above preferred embodiment to designate the same or equivalent parts.

As illustrated in (a) and (b) in FIG. 9, a composite electronic component 10F of the present preferred embodiment has the multilayer wiring block 11, the chip-type electronic component built-in multilayer block 12, and the second chip-type electronic component 13. The insulating layers of each of these multilayer wiring block 11 and the chip-type electronic component built-in multilayer block 12 are formed of a thermosetting resin. The individual multilayer wiring block 11, chip-type electronic component built-in multilayer block 12, and the second chip-type electronic component 13 are provided with the external terminal electrodes 11E, 12F, and 13A, respectively, on the bottom surfaces. Each of the external terminal electrodes 11E, 12F, and 13A have configurations according to the external terminal electrode used in each of the above preferred embodiments. In the present preferred embodiment, the second chip-type electronic component 13 is sealed with a thermosetting resin 18A in advance and configured as a chip-type electronic component block 18 having the shape of a block. As illustrated in (b) in FIG. 9, in the composite electronic component 10F, the multilayer wiring block 11, the chip-type electronic component built-in multilayer block 12, and the chip-type electronic component block 18, each formed to have the same height, are electrically interconnected through a first resin block 19 and a second resin block 20 so as to be integrated. The first and second resin blocks 19 and 20 are also formed so as to have the same height as the height of the other blocks.

Figure 9A:
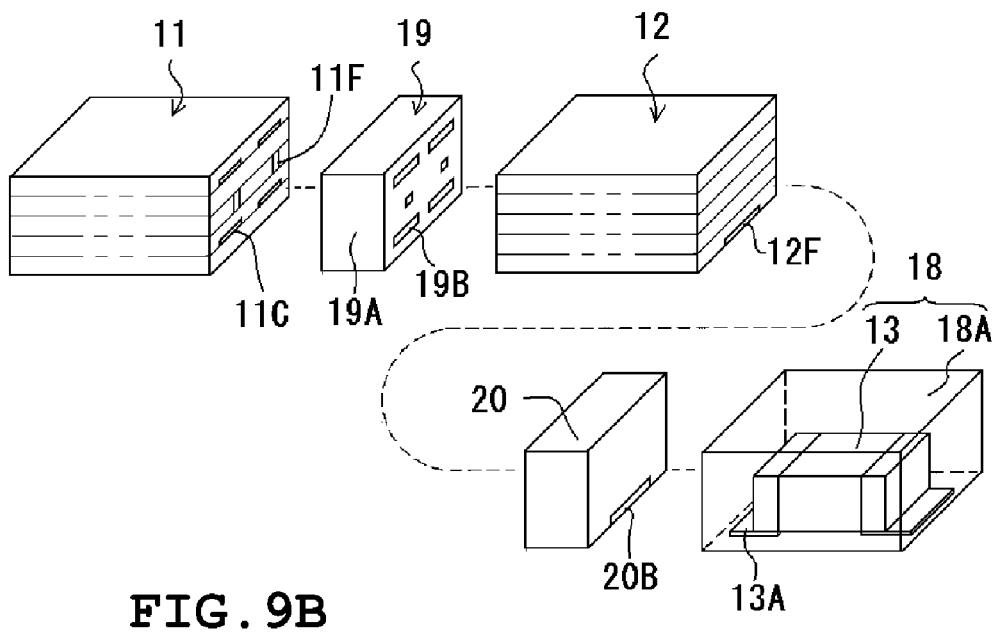
FIGS. 9A and 9B show diagrams illustrating a further preferred embodiment of a composite electronic component of the present invention.
Figure 9B:
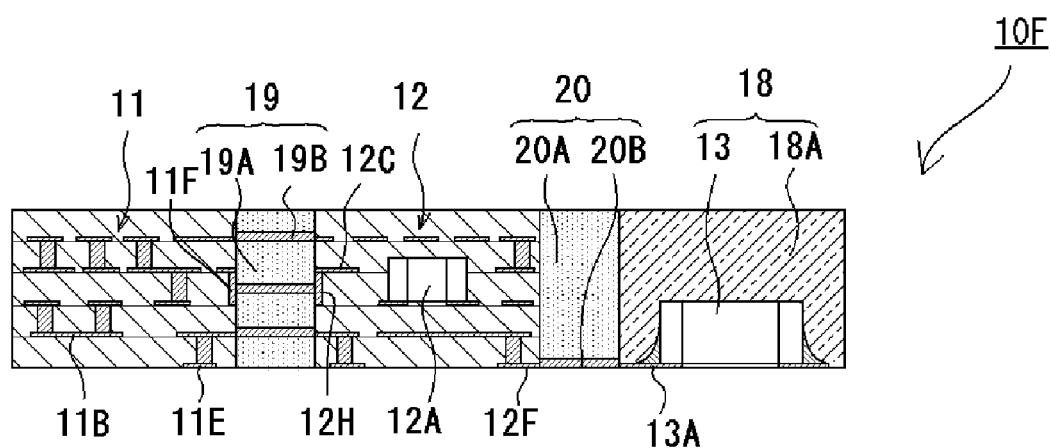

Then, as illustrated in FIGS. 9A and 9B, the first resin block 19 includes a laminated body 19A having a plurality of laminated insulating layers (for example, resin prepreg sheets) and a connecting conductor 19B defining an inner conducting plate formed on a predetermined insulating layer in the laminated body 19A so as to extend from one side to another side. The connecting conductor 19B is provided on both sides of the laminated body so as to define an interface connecting the adjacent multilayer wiring block 11 and the chip-type electronic component built-in multilayer block 12. The connecting conductor 19B is defined by an inner conducting plane having a predetermined pattern. In addition, as illustrated in FIG. 9B, for example, a side conducting plane 11F is disposed on connecting surfaces of the multilayer wiring block 11 and the first resin block 19 as necessary. Likewise, a side conducting plane 12H is disposed on connecting surfaces of the chip-type electronic component built-in multilayer block 12 and the first resin block 19 as necessary. Then, with these side conducting planes 11F and 12H, the multilayer wiring block 11 and the chip-type electronic component built-in multilayer block 12 are electrically connected through the first resin block 19 with increased reliability, even if there is a difference in level between each of the connecting conductor 19B of the first resin block 19 and the inner conducting plane 11C of the multilayer wiring block or the inner conducting plane 12D of the chip-type electronic component built-in multilayer block 12.

As illustrated in FIGS. 9A and 9B, the second resin block 20 is configured similar to the first resin block 19, and its connecting conductor 20B is disposed on both sides of a laminated body 20A. This connecting conductor 20B defines the bottom surface of the laminated body 20A and connects the external terminal electrode 12F of the chip-type electronic component built-in multilayer block 12 and the external terminal electrode 13A of the second chip-type electronic component 13 in the chip-type electronic component block 18.

When the composite electronic component 10F of the present preferred embodiment is produced, firstly, the multilayer wiring block 11, the chip-type electronic component built-in multilayer block 12, the chip-type electronic component block 18, and the first and second resin blocks 19 and 20 are produced. These blocks are formed so as to have substantially the same shape. The multilayer wiring block 11, the chip-type electronic component built-in multilayer block 12, and the chip-type electronic component block 18 are cured or fired blocks. However, the first and second resin blocks 19 and 20 are made of an uncured thermosetting resin. Then, these blocks 11, 12, 18, 19, and 20 are aligned on a detachable sheet in the order illustrated in FIG. 9A. Then, these aligned blocks are heated to a temperature at which the thermosetting resin of the first and second resin blocks 19 and 20 for connection are cured, under a state in which the surfaces of the longitudinally opposite ends and the top and bottom surfaces of the blocks are fixed. At the same time, a predetermined pressure is applied from the remaining side surfaces of the blocks so that the blocks are heat-press-bonded so as to be integrated. Then the blocks are cooled, and thus, the composite electronic component 10F is obtained. When the composite electronic component 10F is provided on a predetermined mounting substrate (not shown), the composite electronic component 10F is detached from the sheet and attached to the predetermined mounting substrate by soldering.

As describe in the foregoing, according to the present preferred embodiment, the same effects as those in the above-described preferred embodiments are produced. In addition, by combining the multilayer wiring block 11, the chip-type electronic component built-in multilayer block 12, the chip-type electronic component block 18, and the first and second resin blocks 19 and 20, the composite electronic component 10F which is suitable for various purposes is obtained.

Figure 10:
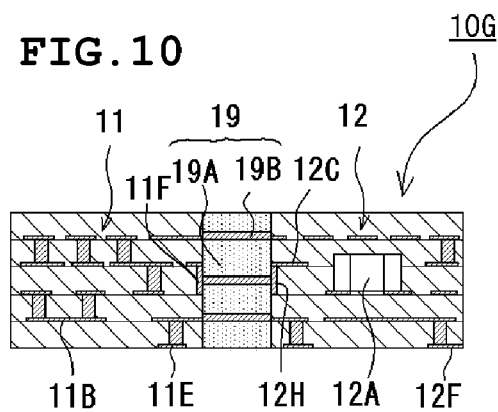
FIG. 10 is a perspective diagram illustrating a further preferred embodiment of a composite electronic component of the present invention.
Figure 11:
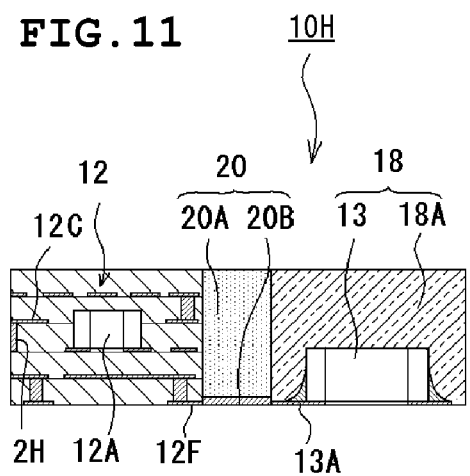
FIG. 11 is a perspective diagram illustrating a further preferred embodiment of a composite electronic component of the present invention.
Figure 12:
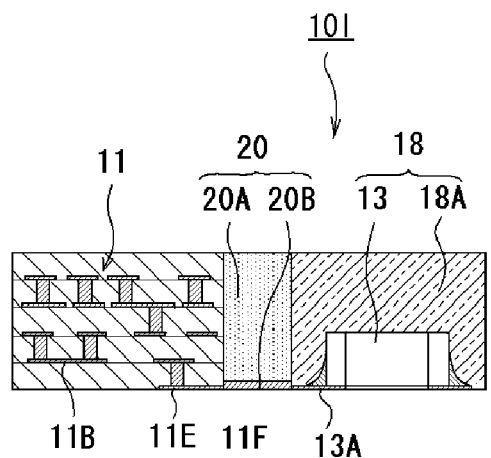
FIG. 12 is a crass-sectional diagram illustrating a further preferred embodiment of a composite electronic component of the present invention.

In the present preferred embodiments, the composite electronic component 10F is illustrated, in which the multilayer wiring block 11, the chip-type electronic component built-in multilayer block 12, the chip-type electronic component block 18, each having substantially the same height, are electrically connected through the first and second resin blocks 19 and 20, so as to be integrated. However, as illustrated in FIGS. 10 to 12, the composite electronic component of the present invention may be configured such that at least two of the multilayer wiring block 11, the chip-type electronic component built-in multilayer block 12, and the chip-type electronic component block 18 are appropriately selected according to need, and the selected two parts are electrically connected through the first resin block 19 or the second resin block 20. An example of such a modification will be described using the same reference numerals as those in the present preferred embodiment to refer to the same or equivalent parts.

As illustrated in FIG. 10, a composite electronic component 10G of a first modification example has the multilayer wiring block 11, the chip-type electronic component built-in multilayer block 12, and the first resin block 19 electrically connecting these parts 11 and 12. The other features are configured according to the composite electronic component 10F illustrated in FIGS. 9A and 9B. When the chip-type electronic component built-in multilayer block 12 includes a plurality of the first chip-type electronic components 12A, at least a portion of the wiring pattern 12C of the chip-type electronic component built-in multilayer block 12 can be shared by the multilayer wiring block 11. Thus, it is not necessary to extend the wiring pattern in the upper or lower direction. Accordingly, similar to the fourth preferred embodiment, at least a portion of the wiring pattern 12C of the chip-type electronic component built-in multilayer block 12 can be shared by the multilayer wiring block 11, and the wiring pattern 12C of the chip-type electronic component built-in multilayer block 12 needs not be extended in the upper or lower direction. This facilitates a reduction of the profile of the composite electronic component 10G.

As illustrated in FIG. 11, a composite electronic component 10H of a second modification includes the chip-type electronic component built-in multilayer block 12, the chip-type electronic component block 18, and the second resin block 20 electrically connecting these parts 12 and 18. The other features of the composite electronic component 10H are configured according to the composite electronic component 10F illustrated in FIGS. 9A and 9B. When the composite electronic component includes a coil component, the chip-type electronic component containing the coil component is configured as the second chip-type electronic component 13 in the chip-type electronic component block 18. With this arrangement, the chip-type electronic component including the coil component can be removed from the chip-type electronic component built-in multilayer block 12. Thus, the chip-type electronic component including the coil component is provided independently as the chip-type electronic component block 18, and no wiring pattern is disposed above and below the chip-type electronic component including the coil component. Further, the chip-type electronic component including the coil component is sealed with a resin portion 18A. Accordingly, a magnetic field caused by the coil component is not substantially affected by the wiring pattern 12C of the chip-type electronic component built-in multilayer block 12, similar to the fourth embodiment. Thus, the composite electronic component 10H has greatly improved reliability.

As illustrated in FIG. 12, a composite electronic component 101 of a third modification example includes the multilayer wiring block 11, the chip-type electronic component block 18, and the second resin block 20 electrically connecting these two parts 11 and 18. The other features of the composite electronic component 101 are configured according to the composite electronic component 10F illustrated in FIGS. 9A and 9B. When the second composite electronic component 13 in the chip-type electronic component block 18 includes a coil component, the wiring portion of the second chip-type electronic component 13 is provided independently as the multilayer wiring block 11 and disposed to a side of the chip-type electronic component block 18 through the second resin block 20. Thus, no wiring pattern is disposed above and below the second chip-type electronic component 13 including the coil component, and further, the second chip-type electronic component 13 is sealed with the resin portion 18A. Accordingly, the composite electronic component 10I, in which a magnetic field caused by the coil component is not substantially affected by the wiring pattern 11B of the multilayer wiring block 11, is obtained, similar to the fourth preferred embodiment.

Figure 13:
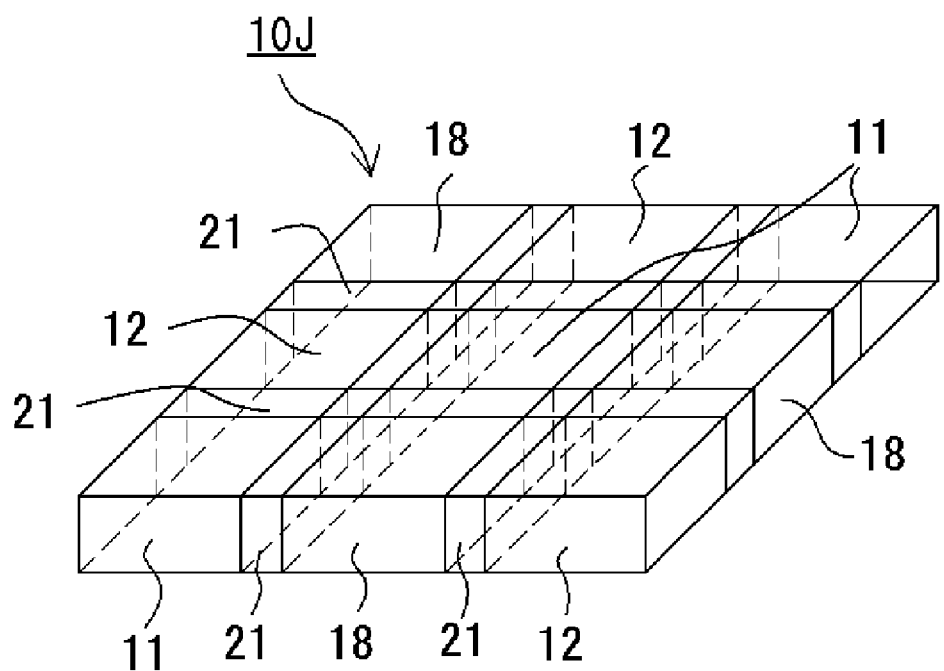
FIG. 13 is a crass-sectional diagram illustrating a further preferred embodiment of a composite electronic component of the present invention.
Figure 14:
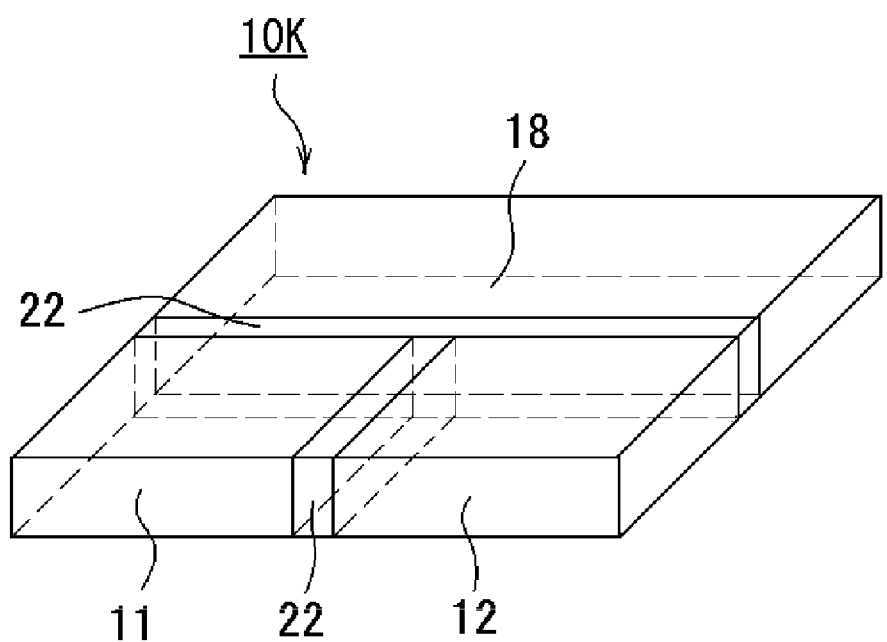
FIG. 14 is a crass-sectional diagram illustrating a further preferred embodiment of a composite electronic component of the present invention.

As illustrated in FIGS. 13 and 14, a composite electronic component of the present invention is configured such that an appropriate number of each of the multilayer wiring block 11, the chip-type electronic component built-in multilayer block 12, and the chip-type electronic component block 18 are selected or an appropriate number of the blocks each including an appropriate shape are arranged, so as to be integrated, in accordance with the functions of the composite electronic component. In addition, the composite electronic component of the present invention can also be configured such that an appropriate number of only the same type of blocks are arranged so as to be integrated.

Fifth Preferred Embodiment

As illustrated in FIG. 13, a composite electronic component 10J of the present preferred embodiment includes the multilayer wiring block 11, the chip-type electronic component built-in multilayer block 12, the chip-type electronic component block 18 each configured to have substantially the same height, width, and length and a resin block 21 electrically and mechanically connecting adjacent blocks. These are arranged in accordance with the desired purpose and preferably configured to have a substantially rectangular shape.

According to the present preferred embodiment, the same effects as those in the fourth preferred embodiment are obtained. In addition, by appropriately combining each of the multilayer wiring block 11, the chip-type electronic component built-in multilayer block 12, the chip-type electronic component block 18, and the resin block 21, the composite electronic component 10J which meets various purposes is obtained.

Sixth Preferred Embodiment

As illustrated in FIG. 14, in a composite electronic component 10K of the present preferred embodiment, any two of the multilayer wiring block 11, the chip-type electronic component built-in multilayer block 12, and the chip-type electronic component block 18 are configured to have substantially the same size, and the other one is configured to have an area which is approximately double the area of each of the two blocks. These blocks 11, 12, and 18 preferably have a substantially rectangular shape as a whole, and are electrically and mechanically interconnected through a resin block 22.

According to the present preferred embodiment, the same effects as those in the fourth preferred embodiment are achieved. In addition, by appropriately combining each of the multilayer wiring block 11, the chip-type electronic component built-in multilayer block 12, the chip-type electronic component block 18, and the resin block 22, the composite electronic component 10K which meets various purposes is obtained.

It should be noted that the present invention is not limited to the preferred embodiments described above. For example, a plurality of each of multilayer wiring blocks, chip-type electronic component built-in multilayer blocks, and chip-type electronic components may be provided. In addition, the blocks can be made of different materials or have different characteristics. In short, any composite electronic components having the multilayer wiring block, the chip-type electronic component built-in multilayer block, and the chip-type electronic component, each having a different function, which are electrically interconnected and arranged on the same plane, and its manufacturing method, or any composite electronic component in which the multilayer wiring block, the chip-type electronic component built-in multilayer block, and the chip-type electronic component are press-bonded and electrically interconnected through a resin block, and its manufacturing method, are encompassed by the present invention. Further, a plurality of the multilayer wiring blocks, the chip-type electronic component built-in multilayer blocks, and the chip-type electronic components may be provided. In addition, the blocks may be made of different materials, or may have different materials.

The present invention is preferably applied, for example, to a composite electronic component used in a mobile communication device such as a portable phone and to a method of manufacturing the composite electronic component.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A composite electronic component comprising:
   a supporting substrate;
   at least two of a multilayer wiring block having a plurality of laminated insulating layers and a wiring pattern, a chip-type electronic component built-in multilayer block having a plurality of laminated insulating layers and including a plurality of first chip-type electronic components disposed on different ones of the plurality of laminated insulating layers and facing in the same direction, and a second chip-type electronic component composed of a passive component or an active component disposed on a surface of the supporting substrate; wherein the at least two of the multilayer wiring block, the chip-type electronic component built-in multilayer block, and the second chip-type electronic component are electrically interconnected and arranged on the surface of the supporting substrate so as to be arranged in substantially the same plane; and the supporting substrate includes only one or two layers.

2. The composite electronic component according to claim 1, wherein the at least two of the multilayer wiring block, the chip-type electronic component built-in multilayer block, and the second chip-type electronic component are covered with a resin.

3. The composite electronic component according to claim 1, wherein the supporting substrate includes a surface wiring pattern arranged to electrically interconnect the at least two of the multilayer wiring block, the chip-type electronic component built-in multilayer block, and the second chip-type electronic component.

4. The composite electronic component according to claim 1, wherein the multilayer wiring block, the chip-type electronic component built-in multilayer block, and the second chip-type electronic component are included.

5. The composite electronic component according to claim 1, wherein the at least two of the multilayer wiring block, the chip-type electronic component built-in multilayer block, and a chip-type electronic component block in which the second chip-type electronic component is resin-sealed are integrated by a resin block.

6. The composite electronic component according to claim 1, wherein the multilayer wiring block and the chip-type electronic component built-in multilayer block are made of different materials.

7. The composite electronic component according to claim 5, wherein the resin block includes a connecting wiring arranged to electrically interconnect the at least two of the multilayer wiring block, the chip-type electronic component built-in multilayer block, and the chip-type electronic component block.

8. The composite electronic component according to claim 5, wherein each of the multilayer wiring block, the chip-type electronic component built-in multilayer block, and the chip-type electronic component block are integrated by a resin block.

* * * * *